(12) United States Patent
Hilgendorf et al.

(10) Patent No.: US 7,602,874 B2
(45) Date of Patent: Oct. 13, 2009

(54) PROVIDING ACCURATE TIME-BASED COUNTERS FOR SCALING OPERATING FREQUENCIES OF MICROPROCESSORS

(75) Inventors: Rolf Hilgendorf, Austin, TX (US); Jens Kuenzer, Leinfelden-Echterdingen (DE); Cedric Lichtenau, Boeblingen (DE); Thomas Pflueger, Leinfelden (DE); Martin Recktenwald, Steinenbronn (DE); Andreas Schmid, Karlsruhe (DE)

(73) Assignee: International Business Machines Corporation, Armonk, NY (US)

( * ) Notice: Subject to any disclaimer, the term of this patent is extended or adjusted under 35 U.S.C. 154(b) by 611 days.

(21) Appl. No.: 11/340,449

(22) Filed: Jan. 26, 2006

(65) Prior Publication Data

US 2007/0172010 A1 Jul. 26, 2007

(51) Int. Cl.
*H04L 7/00* (2006.01)
(52) U.S. Cl. .................. 375/371; 375/354; 709/248
(58) Field of Classification Search ............... 375/371, 375/354; 709/248
See application file for complete search history.

(56) References Cited

U.S. PATENT DOCUMENTS

| | | | | |
|---|---|---|---|---|
| 5,721,888 A | * | 2/1998 | Miller et al. | 713/502 |
| 6,239,635 B1 | * | 5/2001 | Matsuzaki | 327/160 |
| 2005/0083087 A1 | * | 4/2005 | DeMent et al. | 327/141 |
| 2005/0163273 A1 | * | 7/2005 | Scheffel | 375/354 |
| 2008/0226008 A1 | * | 9/2008 | Hilgendorf et al. | 375/371 |

* cited by examiner

*Primary Examiner*—Shuwang Liu
*Assistant Examiner*—Michael R Neff
(74) *Attorney, Agent, or Firm*—Stephen R. Tkacs; Stephen J. Walder, Jr.; Matthew B. Talpis (57) ABSTRACT

A mechanism provides accurate time-based counters for scaling operating frequencies of microprocessors. The mechanism makes use of a time-based counter circuit configuration in which a fixed frequency clock is derived from a PLL of the clock generation circuit of the microprocessor and is used to feed the external and internal timebase logic as well as a timebase accumulator counter. The timebase accumulator counter accumulates the tick events from the timebase logic between two core clocks. The accumulated value is transferred to the core clock domain on every clock edge of a scalable clock and the accumulator is then reset. Because the accumulated ticks are transferred to the core clock domain before the accumulator is reset, no ticks are ever lost using the circuitry of the illustrative embodiment.

18 Claims, 6 Drawing Sheets

PROVIDING ACCURATE TIME-BASED COUNTERS FOR SCALING OPERATING FREQUENCIES OF MICROPROCESSORS

BACKGROUND

1. Technical Field

The present application is directed to microprocessors. More specifically, the present invention is directed to a system, apparatus and method of providing accurate time-based counters for scaling operating frequencies of microprocessors.

2. Description of Related Art

With the rapid increase in transistor density and speed, the amount of power that may be dissipated by a chip is increasingly becoming a critical criterion in chip designs. Particularly, each successive shrink in technology provides an increase in density, allowing for a reduction in chip footprint. This allows the chip to operate at higher frequencies. Since the chip footprint is increasingly being reduced, less power is being dissipated through the chip itself. Any method, therefore, that may be used to decrease the power consumed by a chip may translate into an increase in performance.

One method that may be used to decrease the power consumption of a chip is frequency scaling. Frequency scaling allows a chip to operate at full frequency during short spans of time when high performance is needed and to operate at lower frequencies at other times. Specifically, the power consumption of a chip may be represented by the following equation:

$$\text{power} = K\alpha C(V^2)F + QV^2$$

where V is the chip's core voltage, F is the chip's operating frequency, α is the chip's activity factor, C is the chip's effective capacitance, and K and Q are constants that are dependant of the manufacturing process among other factors. From this equation it can be seen that the operating frequency of a chip is directly proportional to its power consumption. Thus, a decrease in frequency will correspondingly lead to a decrease in power consumption.

To determine whether or not the operating frequency of a chip is to be scaled up or down, the average activity occurring in the chip over an elapsed time needs to be calculated. If the activity in the chip over the elapsed time is high, then the chip may operate at a higher frequency. If on the other hand, the activity in the chip is low, the chip may operate at a lower frequency.

In a computer system, a time-based counter is used to measure elapsed time. Obviously, the counter should increment at a constant speed. The speed is usually derived from a frequency clock. To be more specific, the speed at which the counter increments may either be $1/n^{th}$ of a core frequency clock, where n is an integer (for an internal time-based counter) or determined by the rising edge of an external clock signal supplied by the system (for an external time-based counter), as described, for example, in the PowerPC Architecture Book III.

Figure 1:
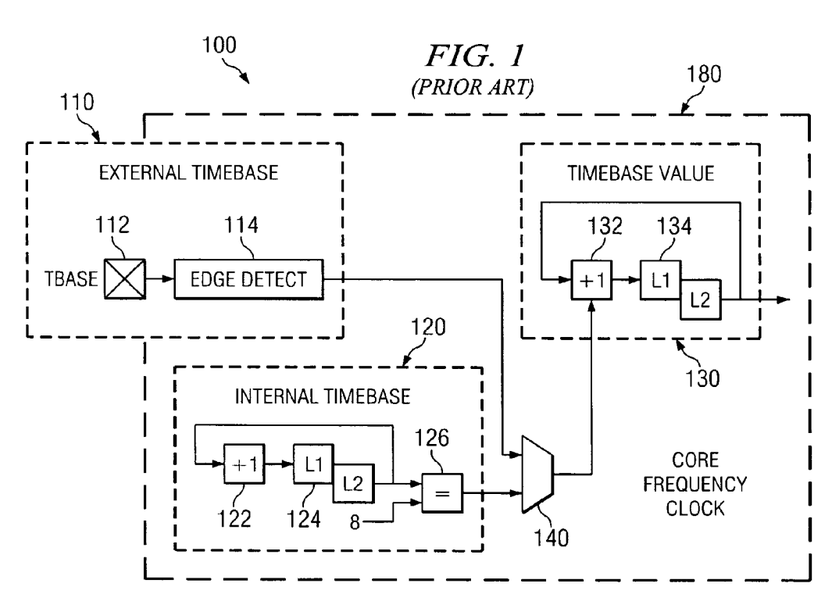
FIG. 1 is an exemplary diagram of a time-based counter in accordance with a known circuit configuration.

FIG. 1 is an exemplary diagram of a time-based counter in accordance with a known circuit configuration. As shown in FIG. 1, the circuit configuration includes an external timebase portion 110, an internal timebase portion 120, and a timebase value generation portion 130. The external timebase portion 110 includes a timebase (tbase) input pin 112 and edge detection logic 114. All circuit elements used in the circuit shown in FIG. 1 are clocked by an internal or core clock signal, i.e. are in the core frequency clock domain 180.

The external timebase portion 110 allows an external device to provide a clocking signal to the time-based counter via the timebase input pin 112. The edge detection logic 114 of the external timebase portion 110 generates a "tick," i.e. an increment of a timebase value by 1, from the external timebase signal, each time a rising edge of the external timebase signal is detected. The internal timebase portion 120 is a modulo 8 (or any other arbitrary number of cycles) counter that generates a tick every 8 internal or core clock cycles. The internal timebase portion 120 includes an incrementer 122, latches 124, and comparator 126.

The outputs from the external and internal timebase portions 110 and 120, are provided to a multiplexer 140. In the PowerPC architecture, an architected register is provided that selects if the system will use an internal or external timebase. Based on this selection, the corresponding portion 110 or 120 is selected via multiplexer 140 to generate a tick.

The timebase value generation portion 130 includes an incrementer 132 and latches 134. The incrementer 132 increments an output timebase value in response to an input from the multiplexer 140. The incrementer 132 of the timebase value generation portion 130 increments the timebase value by one for every tick received. The resulting timebase value is output for use by the microprocessor in measuring an elapsed time, such as for measuring an amount of work done in a frequency independent time period which may then be used to determine whether to scale up or down the operating frequency of the microprocessor.

Using either the external timebase or the internal timebase to measure elapsed time during frequency scaling may lead to inaccurate results. For example, if the internal time-based counter is used, the counter will count slower at lower core clock frequencies and faster at higher core clock frequencies. Thus, the time-based counter circuit 100 will not increment at a constant speed.

Moreover, the core frequency may be scaled to a very low value for maximal power reduction. This frequency value may be smaller than the timebase increased frequency required in the system for accurate time measurement. In this case, the timebase value generation portion 130 will become inaccurate since the internal timebase portion 120, if the internal timebase is selected, cannot generate ticks precisely due to the core clock being too slow. Alternatively, if the external timebase is selected, the external timebase portion 110 will not be able to detect some of the rising edges of the external timebase signal 112 because the core frequency that is used to detect an edge on the external timebase signal 112 is slower than the external timebase signal 112 itself. This again leads to inaccuracy in the timebase value generation portion 130.

Figure 2:
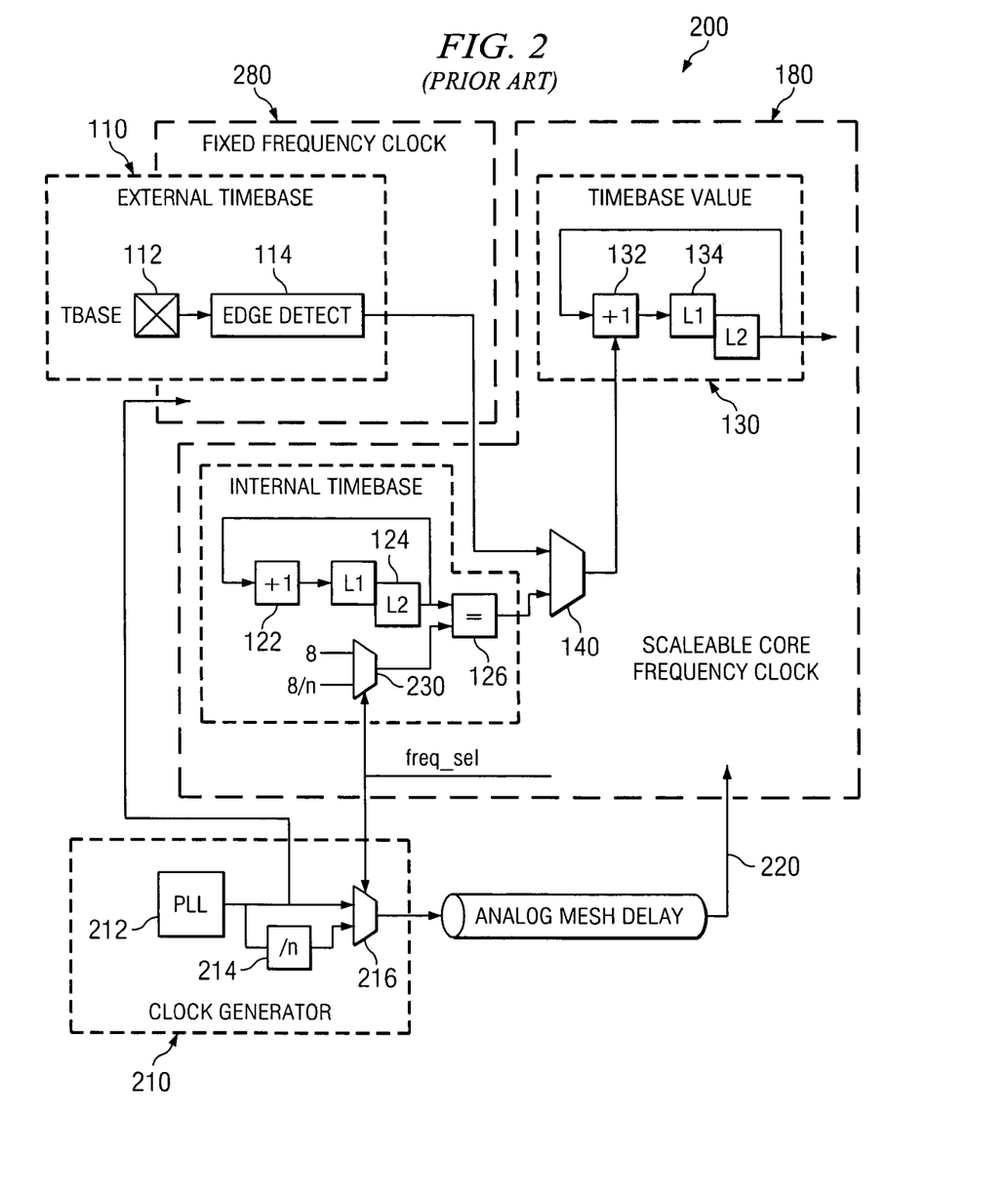
FIG. 2 is a diagram of a time-based counter using a fixed frequency clock in accordance with a known circuit configuration.

One obvious solution is to use a fixed frequency clock. FIG. 2 is a diagram of a time-based counter using a fixed frequency clock in accordance with a known circuit configuration. As shown in FIG. 2, the fixed frequency clock may be derived directly from a phase-locked loop (PLL) 212 in a clock generation portion 210. A PLL is an electronic circuit that controls an oscillator so that the oscillator maintains a constant phase angle (i.e., lock) on the frequency of a reference signal.

In the circuitry shown in FIG. 2, the clock generation portion 210 includes the PLL 212, a divider 214, and a multiplexer 216 for selecting between the fixed frequency clock signal output of the PLL 212 or a divided, or scaled down, output of the PLL 212 that is output by the divider 214. A frequency select signal (freq_sel) is used to select between these two outputs that are provided as a scalable core frequency clock 220.

The frequency select signal is also provided to a multiplexer 230 in the internal timebase portion to select between an 8 cycle input signal and a scaled down 8 cycle input signal, i.e. 8/n. In this way, if the scalable core frequency clock is scaled down, so will the number of cycles be scaled down by the same amount for generation of the internal timebase value. In other words, when the clock frequency is scaled, e.g., halved, via the freq_sel signal, the maximum value for the internal timebase counter is also halved to reflect the change.

In the depicted example, the edge detect circuit 114 of the external timebase portion 110 runs at the fixed frequency generated by the PLL 212, which is a higher frequency than the external timebase clock signal received via the timebase input pin 112. Hence, the rising edge of the external timebase clock signal may be sampled correctly. A problem occurs, however, in that if the core clock frequency becomes lower than the tick frequency of the external timebase portion 110, then some of the ticks produced by the edge detection circuit 114 will be missed in the core frequency clock domain 180 and not added to the timebase value as they should be.

If the internal timebase method is used, as described above, one can change the modulo counter to count only to a portion, e.g., half, of the maximum value, e.g., 4 instead of 8 in the depicted example, when halving the core clock frequency. This would result in a tick being generated at a constant frequency. This option has two main limitations, however. First, one cannot scale the frequency by a larger factor than the maximum value of the modulo counter, e.g., 8. Second, due to the analog delay of the clock mesh that may vary between 0 and 3 core clock cycles, for example, depending on the core clock frequency and chip manufacturing parameters, it is not possible to change the core clock frequency exactly at the same time as the internal timebase multiplexer 230. Hence, if the microprocessor performs a number of frequency scaling operations during normal operation, as is desirable to reduce the power consumption of the microprocessor, one or more ticks will eventually be lost over time.

In other words, if the processor frequency is low such that the analog mesh delay is less than a cycle and the frequency scaling happens when the internal timebase is 0, no ticks would be lost. However, if the processor is running at a very high frequency, the analog delay on the clock mesh, represented in FIG. 2 as the analog mesh delay, exceeds one or more clock cycles. Thus, switching the freq_sel signal when the internal timebase is 0 will result in the clock on the mesh effectively slowing down only one or more cycles later and hence, the timebase counter will not count correctly. With aggressive power management in high frequency microprocessors, the clock mesh frequency will also be reduced below the external timebase update rate. As a result, the core cannot increment its timebase value fast enough and, as with the previous example above, the circuit may miss "ticks."

SUMMARY

In one illustrative embodiment, a circuit is provided that comprises a first circuit portion that is driven by a fixed frequency clock signal and a second circuit portion, coupled to the first circuit portion, that is driven by a scalable frequency core clock signal. The first circuit portion may accumulate a sum of ticks of one of an internal timebase counter or a sampled external timebase signal based on the fixed frequency clock signal and may provide the accumulated sum of ticks to the second circuit portion based on the scalable frequency core clock signal.

The first circuit portion may include a timebase accumulator that is driven by the fixed frequency clock signal and accumulates the sum of ticks. The timebase accumulator may comprise an edge detect circuit element that detects an edge of a reset signal sent from the second circuit portion based on the scalable frequency core clock signal. The accumulated sum of ticks may be provided to the second circuit portion in response to detecting the edge of the reset signal.

The first circuit portion may comprise an external timebase circuit that comprises a timebase signal input pin and an edge detect circuit element that detects an edge of a timebase input signal received via the timebase signal input pin. The edge detect circuit element may generate a tick in response to detecting a rising edge of the timebase input signal.

In another illustrative embodiment, a method for determining a timebase value for use in performing time based operations is provided. The method may comprise generating a fixed frequency clock signal, generating a scalable frequency core clock signal, and accumulating a sum of ticks of one of an internal timebase counter or a sampled external timebase signal based on the fixed frequency clock signal. The method may further comprise adding the accumulated sum of ticks to a previously stored timebase value based on the scalable frequency core clock signal to generate an updated timebase value and outputting the updated timebase value for use by a microprocessor to perform time based operations.

Accumulating a sum of ticks may comprise using a timebase accumulator that is driven by the fixed frequency clock signal and accumulates the sum of ticks. The timebase accumulator may comprise an edge detect circuit element that detects an edge of a reset signal sent from the second circuit portion based on the scalable frequency core clock signal. The accumulated sum of ticks may be added to the stored timebase value in response to detecting the edge of the reset signal.

The first circuit portion may comprise a timebase signal input pin and an edge detect circuit element that detects an edge of a timebase input signal received via the timebase signal input pin. The edge detect circuit element may generate a tick in response to detecting a rising edge of the timebase input signal.

In yet another illustrative embodiment, a method is provided for providing a circuit. This method may comprise providing a first circuit portion that is driven by a fixed frequency clock signal and providing a second circuit portion, coupled to the first circuit portion, that is driven by a scalable frequency core clock signal. The first circuit portion may accumulate a sum of ticks of one of an internal timebase counter or a sampled external timebase signal based on the fixed frequency clock signal and may provide the accumulated sum of ticks to the second circuit portion based on the scalable frequency core clock signal.

The first circuit portion may include a timebase accumulator that is driven by the fixed frequency clock signal and accumulates the sum of ticks. The timebase accumulator may comprise an edge detect circuit element that detects an edge of a reset signal sent from the second circuit portion based on the scalable frequency core clock signal. The accumulated sum of ticks may be provided to the second circuit portion in response to detecting the edge of the reset signal.

The first circuit portion may comprise an external timebase circuit that comprises a timebase signal input pin and an edge detect circuit element that detects an edge of a timebase input signal received via the timebase signal input pin. The edge detect circuit element may generate a tick in response to detecting a rising edge of the timebase input signal.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

Figure 3:
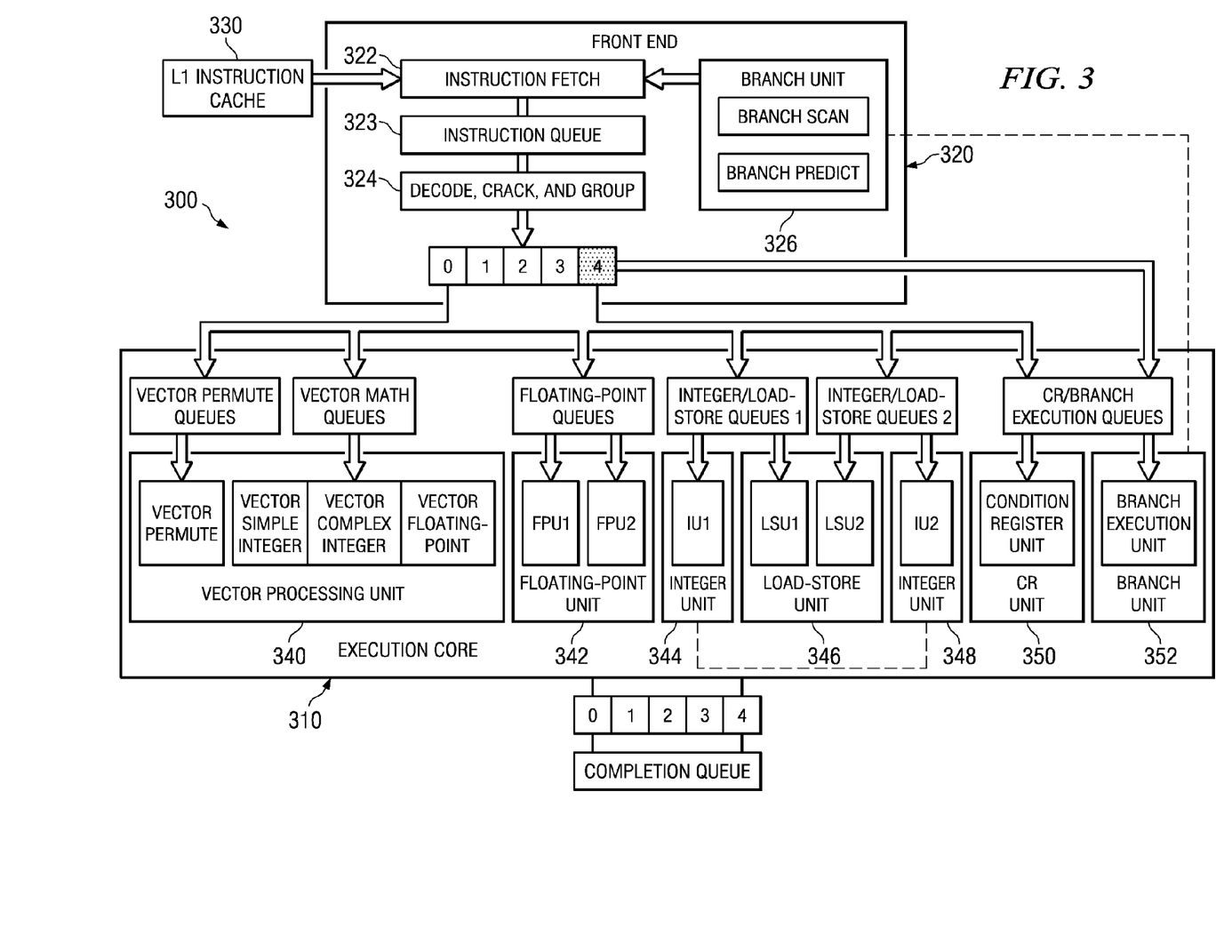
FIG. 3 is an exemplary block diagram or a microprocessor in which the time-based counter circuit configuration of the illustrative embodiments may be implemented.

As mentioned above, the illustrative embodiments provide a mechanism for providing accurate time-based counters for scaling operating frequencies of microprocessors. The mechanism of the illustrative embodiments may be integrated into any microprocessor that is capable of switching operational frequencies. One example of such a microprocessor is the PowerPC970FX microprocessor available from International Business Machines, Inc. of Armonk, N.Y. FIG. 3 is an exemplary block diagram of a microprocessor in which the exemplary aspects of the illustrative embodiments may be implemented. It should be noted that FIG. 3 is only exemplary and is not intended to state or imply any limitation with regard to the types or microprocessor architectures in which the illustrative embodiments may be implemented.

With reference now to the figures, FIG. 3 is an exemplary block diagram or a microprocessor in which the time-based counter circuit configuration of the illustrative embodiments may be implemented. As shown in FIG. 3, the microprocessor 300 includes an execution core 310, a front end 320 having instruction fetch unit 322, instruction queue unit 323, decode, crack & group unit 324, and branch unit 326. Instructions may be fetched from the L1 instruction cache 330 and queued in the instruction queue in accordance with information provided by branch unit 326. Instructions may then be dispatched to the execution core 310.

The execution core 310 includes a vector processing unit 340, a floating point execution unit 342, a first integer execution unit 344, a load-store execution unit 346, a second integer unit 348, a condition register unit 350, and a branch execution unit 352. The vector processing unit 340 may be a SIMD execution unit, for example. The operation of these various elements when executing instructions dispatched from the front end 320 is generally known in the art and thus, a detailed explanation is not provided herein. With regard to the illustrative embodiments of the present invention, the value of the timebase counter of the illustrative embodiments that is used to measure time is read via access to special registers (e.g., via the mfspr instruction) located in the integer unit 348, for example.

The illustrative embodiments provide a mechanism for providing an accurate time-based counter for use in scaling the clocking frequencies at which the elements of the microprocessor 300 operate. Such scaling is especially useful in microprocessor designs that support switching of clocking frequencies to lower frequencies in order to conserve power consumption during periods of low or no utilization. As mentioned above, in such designs, known mechanisms for providing time-based counters suffer from problems in which "ticks," or increments of the time-based counter, are missed due to the switching of clock frequencies. A missed tick is a tick that should have increased the timebase value of a time-based counter but did not for one reason or another. The mechanism of the illustrative embodiments solves this problem by providing an improved time-based counter in which ticks are not missed even when the clocking frequency is switched.

The system, apparatus and method make use of a time-based counter circuit configuration in which a fixed frequency clock is derived from a PLL of the clock generation circuit of the microprocessor and is used to feed the external and internal timebase logic as well as a timebase accumulator counter. The timebase accumulator counter accumulates the tick events from the timebase logic between two core clocks. The accumulated value is transferred to the core clock domain on every clock edge of a scalable clock and the accumulator is then reset. Because the accumulated ticks are transferred to the core clock domain before the accumulator is reset, no ticks are ever lost using the circuitry of the illustrative embodiment.

Figure 4:
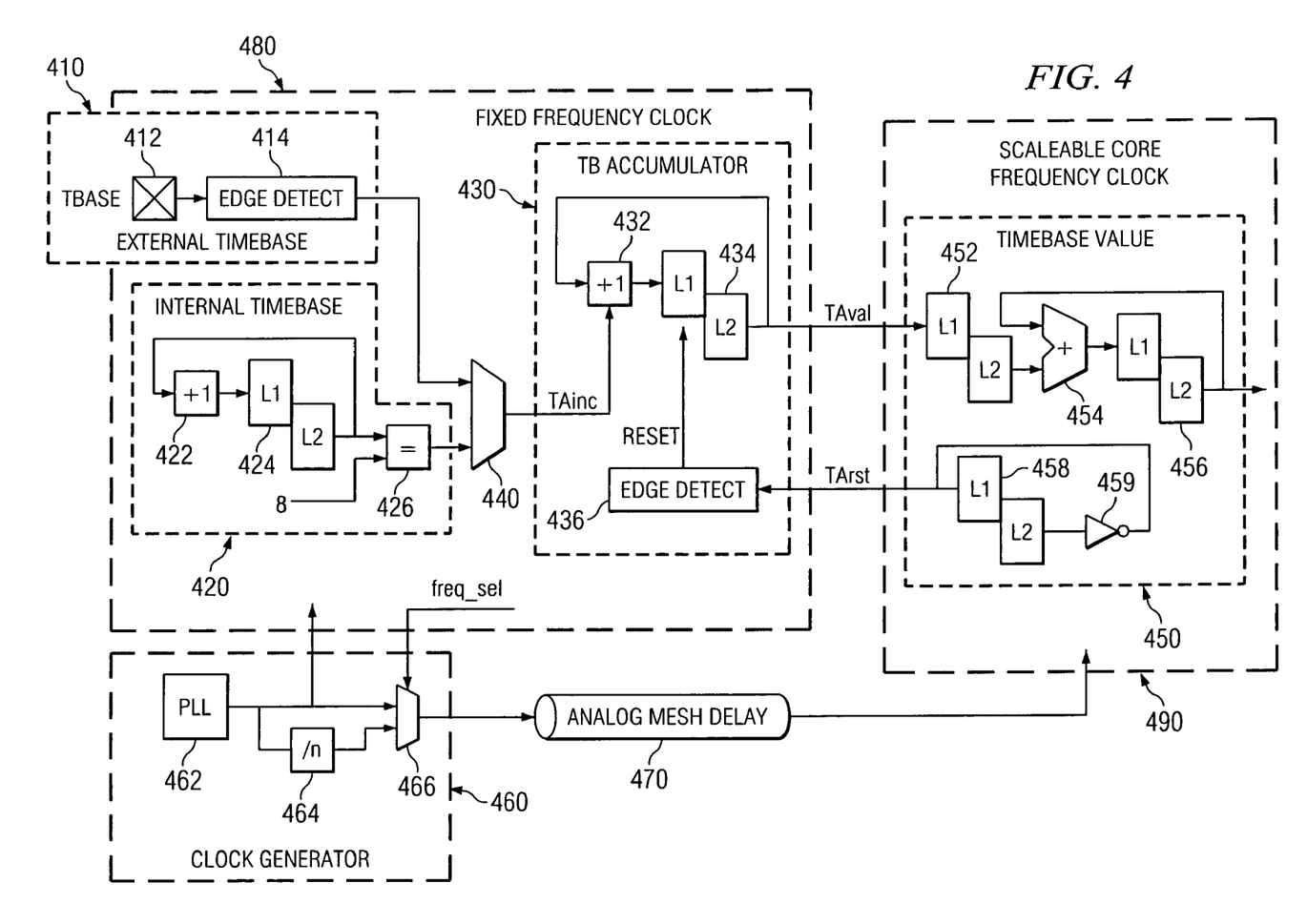
FIG. 4 is an exemplary block diagram of a circuit configuration in accordance with one illustrative embodiment.

FIG. 4 is an exemplary block diagram of a circuit configuration in accordance with one illustrative embodiment. As shown in FIG. 4, the circuit configuration 400 is similar to the circuit configuration shown in FIG. 2 with the addition of the timebase accumulator 430 and circuit elements 452, 454, 458 and 459 in the timebase value generator portion 450. As shown, the fixed clock frequency generated by the PLL 462 in the clock generation circuitry 460 is used to sample the rising edge of the external timebase signal at the timebase input pin 412 using the edge detector 414 of the external timebase portion 410. This same fixed clock frequency is used to feed the internal time base counter portion 420. In the depicted example, the fixed clock frequency has a higher frequency than the frequency of the external timebase signal sampled at the timebase input pin 412.

With regard to the internal timebase counter portion 420 of the circuit 400, ticks are sent to the timebase accumulator 430 every predetermined number of cycles, e.g., every 8 cycles, of the fixed frequency clock signal generated by the PLL 462 of the clock generation circuit 460. The internal timebase accumulator portion 420 increments in response to receiving the fixed frequency clock from the PLL 462 of the clock generation circuitry 460. This fixed frequency clock may be selected independently of the core clock frequency and thus, the internal timebase counter portion 420 may generate ticks which are accumulated in the timebase accumulator portion 430 at a fixed frequency independent of the core clock frequency and sufficient for sampling the external timebase signal correctly. This guarantees a timebase that will be accurate and will not lose ticks due to a switch in clock frequency.

The timebase accumulator portion 430 accumulates ticks generated by the internal timebase counter portion 420. Both the timebase accumulator portion 430 and the internal timebase counter portion 420 are in the fixed frequency clock domain 480 and thus, run at a fixed frequency due to the fixed frequency clock from PLL 462. The timebase accumulator portion 430 accumulates ticks in the latches 434, based on the TAinc signal from either the internal timebase counter portion 420 or from the external timebase counter portion 410 based on the setting at the multiplexer 440, until the accumulated value is transferred safely to the timebase value generator portion 450 in the core clock frequency domain 490. When the accumulated value in the timebase accumulator portion 430 is transferred from the latches 434 to the latches 452 of the timebase value generator portion 450, by way of the Taval signal, the timebase value generator portion 450 adds the accumulated value, via adder 454, to the previously stored value in latches 456 of the timebase value generator portion 450. Thus, the timebase value generated and output by the timebase value generator portion 450 may be incremented by 1 or more depending upon the number of ticks accumulated by the timebase accumulator portion 430.

When a transition, i.e. rising or falling edge, of the scaled core frequency clock is detected by the edge detector 436 of the timebase accumulator portion 430, the current accumulator value stored in the latches 434 is copied over to the latches 452 of the scalable core clock domain 490 and added to the current timebase value in the latches 456 using adder 454. Concurrently in the timebase value generation portion 450 of the circuit 400, a reset signal, i.e. the TArst signal, is toggled in response to the detected transition of the scaled core frequency clock, by way of latches 458 and inverter 459. The reset signal is generated in latches 458 and is used in the edge detector 436 to reset the latches 434 in the same cycle.

The solution provided by the circuitry shown in FIG. 4 works for any arbitrarily selected core clock frequency. Because the fixed frequency clock may be selected independently of the core clock frequency and set so that the external timebase signal may be sampled correctly at the timebase input pin 412, the circuit configuration 400 ensures a timebase that will be accurate and will not lose ticks. Moreover, because the timebase value generated by the timebase value generator portion 450 may be updated based on the scaled core clock frequency, the timebase value may be accessed by the microprocessor in a fast manner, at a frequency determined by the scaled core clock frequency, as is generally required by high performance microprocessor.

Figure 5:
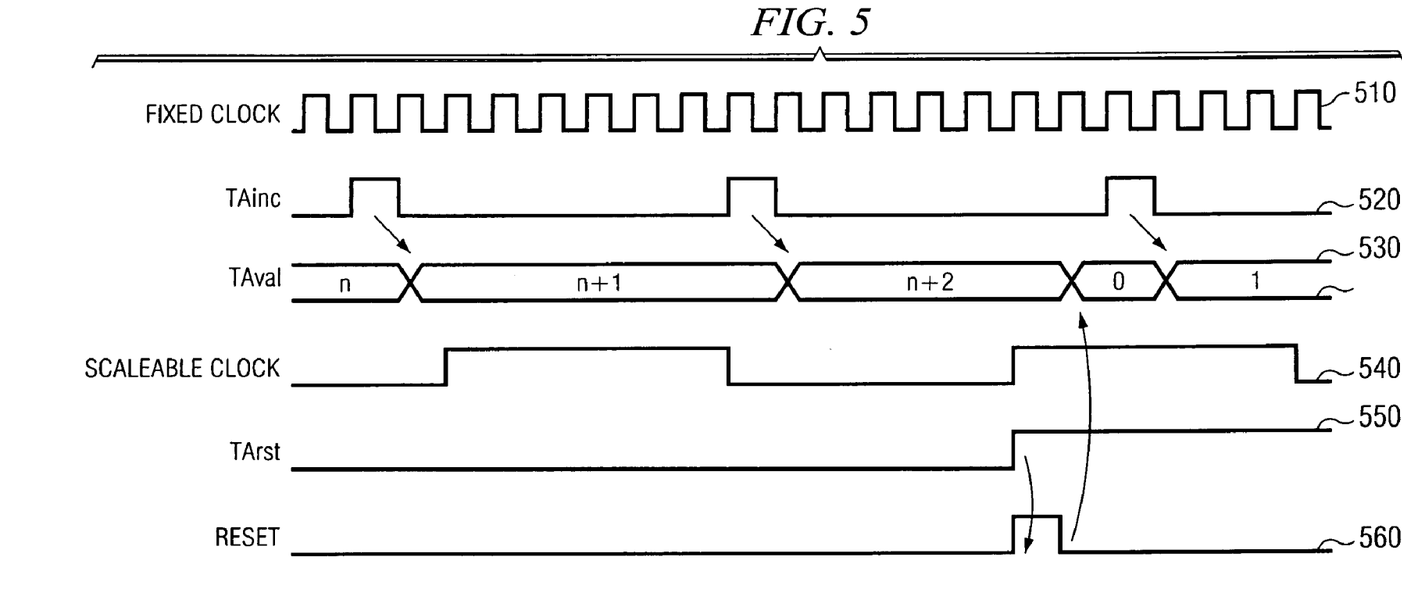
FIG. 5 is a timing diagram illustrating the operation of the circuit configuration shown in FIG. 4 in accordance with one illustrative embodiment.

FIG. 5 is a timing diagram illustrating the operation of the circuit configuration shown in FIG. 4 in accordance with one illustrative embodiment. The fixed clock frequency 510 is used to either generate ticks using the internal timebase counter portion 420 or sample the external timebase signal. As mentioned previously, in the PowerPC architecture as an example, an architected register is provided that selects if the system will use an internal or external timebase. This setting will control the multiplexer 440. It should be noted, however, that the present invention is not limited to such an architecture and various external or internal timebase generation schemes may be used with the mechanisms of the present invention, depending upon the particular implementation, without departing from the spirit and scope of the present invention.

Every time a tick is detected, such as by multiplexer 440, the TAinc signal 520 is pulsed for one cycle. On every TAinc pulse, the accumulator counter signal value, i.e. TAval 530, is increased by 1. The timebase logic in the timebase value generator portion 450 running on the scalable clock frequency 540 will eventually transfer the current TAval value 530 and set the TArst signal 550 to notify the logic running on the fixed frequency clock 510. The fixed frequency clock logic, e.g., edge detector 436, generates a reset signal 560 to reset the accumulator counter value, e.g., the value stored in latches 434, to an initial value, e.g., 0.

The maximum frequency of the external timebase signal input via the timebase input pin 412 is determined by the rising edge detect logic 414 running on the fixed frequency clock. The external timebase input signal, which is an asynchronous signal, goes through debouncing logic (not shown) consisting of 2 latches, followed by 3 latches to detect a logical "1" and to filter glitches. An additional latch is used to detect the edge change. From this, it can be stated that the ratio of the minimum timebase input signal frequency to fixed frequency clock is as follows:

min Tbase-FixedFrequencyClock-Ratio: (3(logical"1" detect)*2(two half period)=1:6

In one illustrative embodiment, a requirement may be introduced by the implementation of the adder 454 that this adder can only add every 8/n cycles when running at 1/nth the full core clock frequency. For the worst case, i.e. n=1, the adder needs 8 cycles and hence, the above ratio must be limited to 1:8. This can be met easily since the external timebase signal will typically have a frequency of about 133 MHz and the PLL 462 will typically deliver a core clock frequency above 1 GHz.

In an illustrative embodiment, the maximum ratio between the fixed frequency clock and the scalable core frequency clock may be limited by the following conditions. First the fixed frequency clock may be required to be at least as fast as the scalable core frequency clock in order to ensure proper operation of the edge detector 414. Second, the slower the core clock frequency is when compared to the fixed clock frequency, the wider the accumulator must be.

The first condition can be easily met since the core clock frequency delivered by the PLL can be used as the fixed frequency clock. Given a maximum ratio between the timebase accumulator increment and the fixed frequency clock of 8:1, the width of the timebase accumulator can be computed with the following formula:

Accumulator width=ceil(ln 2(FixedFreqClock-ScalableFreqClock-Ratio*2+1))

For example, a PowerPC970+ microprocessor supports a maximum clock scaling ratio of 64:1. When implementing the circuit configuration of the illustrative embodiments, the PowerPC970+ microprocessor would require an 8-bit counter for use as the timebase accumulator.

Figure 6:
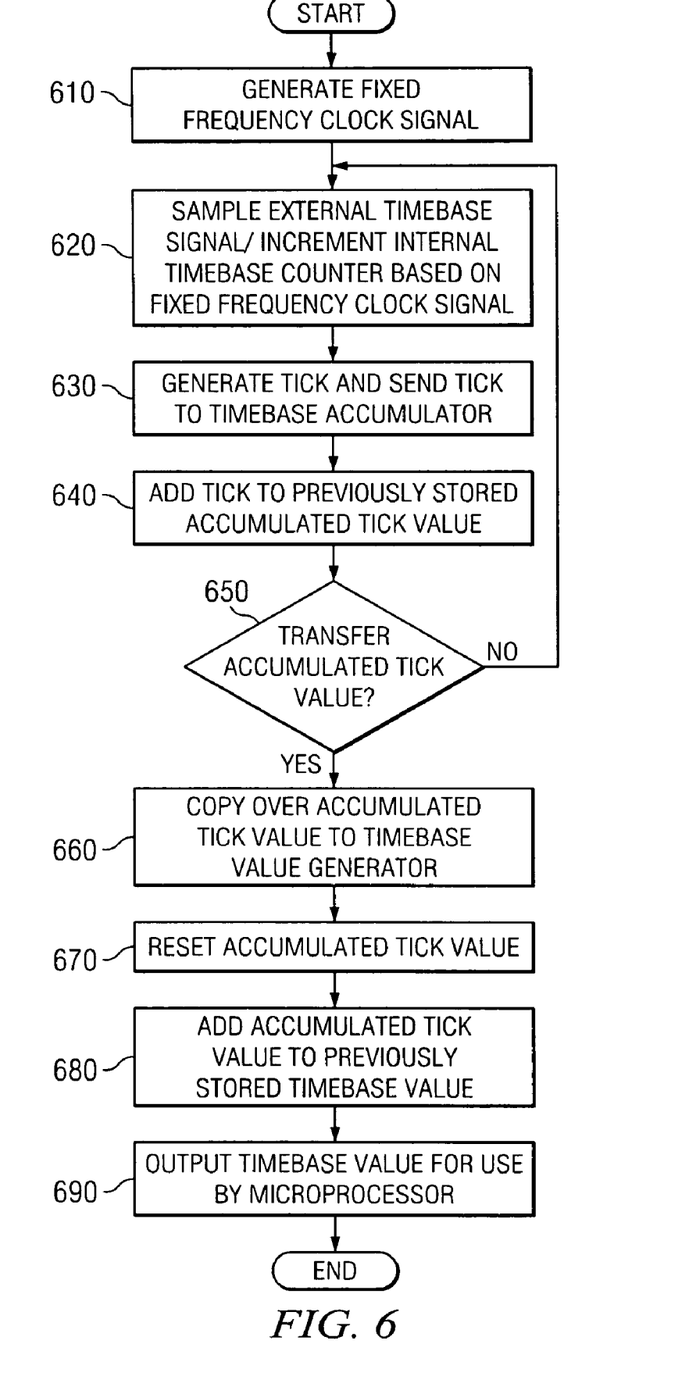
FIG. 6 is a flowchart outlining an exemplary operation of a time-based counter in accordance with one illustrative embodiment.

FIG. 6 is a flowchart outlining an exemplary operation of a time-based counter in accordance with one illustrative embodiment. It should be appreciated that while FIG. 6 shows a particular order of steps, the present invention is not limited to any particular order in which the steps of FIG. 6 are performed. To the contrary, many of the steps in FIG. 6 may be performed in a different order or even substantially simultaneously without departing from the spirit and scope of the present invention.

As shown in FIG. 6, the operation starts by a clock generation circuit generating a fixed frequency clock signal (step 610). An external timebase signal is sampled by an edge detector of an external timebase circuit or an internal timebase counter is incremented based on the fixed frequency clock signal (which one is done is dependent upon the particular implementation) (step 620). A tick is generated based on the sampling of an external time reference signal or the incrementing of the internal timebase counter and is sent to a timebase accumulator (step 630).

The timebase accumulator adds the tick to a previously stored accumulated tick value (step 640). The timebase accumulator determines whether the accumulated tick value is to be transferred to the timebase value generator circuit (step 650). As described previously, this determination may involve detecting an edge transition, i.e. rising or falling edge, of a scalable core clock signal. However, this is only one possible implementation and the present invention is not limited to toggling of a reset signal.

If the accumulated tick value is to be transferred to the timebase value generator circuit, then the value is copied over to the timebase value generator circuit (step 660). The accumulated tick value is then reset in the timebase accumulator (step 670).

The timebase value generator adds the accumulated tick value to a previously stored timebase value (step 680) and outputs the updated timebase value for use by the microprocessor (step 690). The operation then ends. It should be noted that this operation may be repeated continuously while the microprocessor is operational.

Thus, the illustrative embodiments provide a circuit configuration that solves the problems of missed ticks experienced by known circuit configurations. With the circuit of the illustrative embodiments, a first portion of the circuit operates based on a fixed frequency clock and is used to accumulate ticks at a fixed frequency. In a second portion of the circuit, a timebase value is generated based on a scalable core clock frequency and is updated using the accumulated ticks of the first portion of the circuit at a frequency determined by the scalable core clock frequency. As a result, ticks are not missed and the microprocessor, operating at the scalable core clock frequency, can access the proper timebase value at a frequency desired by the microprocessor.

The circuit as described above may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or
(b) an end product.

The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing device, for determining a timebase value for use in performing time based operations, comprising:
    generating a fixed frequency clock signal, wherein the fixed frequency clock signal drivers a first circuit portion within the data processing device;
    generating a scalable frequency core clock signal, wherein the scalable frequency core clock signal drives a second circuit portion coupled to the first circuit portion;
    accumulating, by the first circuit portion, a sum of ticks of one of an internal timebase counter or a sampled external timebase signal based on the fixed frequency clock signal, wherein the internal timebase counter is part of a first circuit portion that comprises a timebase signal input pin and an edge detect circuit element that detects an edge of a timebase input signal received via the timebase signal input pin and wherein the edge detect circuit element generates a tick in response to detecting a rising edge of the timebase input signal;
    adding the accumulated sum of ticks to a previously stored timebase value based on the scalable frequency core clock signal to generate an updated timebase value; and
    outputting the updated timebase value for use by a microprocessor to perform time based operations,
    wherein accumulating a sum of ticks comprises using a timebase accumulator that is driven by the fixed frequency clock signal and accumulates the sum of ticks; and
    wherein the timebase accumulator comprises an edge detect circuit element that detects an edge of a reset signal sent from the second circuit portion based on the scalable frequency core clock signal; and
    wherein the accumulated sum of ticks is added to the stored timebase value in response to detecting the edge of the reset signal.

2. The method of claim 1, wherein the first circuit portion includes the internal timebase counter that is driven by the fixed frequency clock signal, and wherein the internal timebase counter generates a tick every predetermined number of cycles of the fixed frequency clock signal.

3. The method of claim 1, wherein adding the accumulated sum comprises using an adder that receives, as a first input, the accumulated sum of ticks from and, as a second input, a current value of a timebase value, and wherein the adder outputs the updated timebase value.

4. The method of claim 3, wherein the updated timebase value is output by the second circuit portion for use by a microprocessor to perform time based operations.

5. The method of claim 1, wherein the data processing device is part of a microprocessor.

6. The method of claim 5, wherein the microprocessor is part of one of a toy, a game machine, a game console, a hand-held computing device, a personal digital assistant, a communication device, a wireless telephone, a laptop computing device, a desktop computing device, or a server computing device.

7. A circuit, comprising:
a first circuit portion that is driven by a fixed frequency clock signal, wherein the first circuit portion comprises an external timebase circuit that comprises a timebase signal input pin and an edge detect circuit element that detects an edge of a timebase input signal received via the timebase signal input pin and wherein the edge detect circuit element generates a tick in response to detecting a rising edge of the timebase input signal; and
a second circuit portion, coupled to the first circuit portion, that is driven by a scalable frequency core clock signal, wherein the first circuit portion accumulates a sum of ticks of one of an internal timebase counter or a sampled external timebase signal based on the fixed frequency clock signal and provides the accumulated sum of ticks to the second circuit portion based on the scalable frequency core clock signal,
wherein the first circuit portion comprises a timebase accumulator that is driven by the fixed frequency clock signal and accumulates the sum of ticks;
wherein the timebase accumulator comprises an edge detect circuit element that detects an edge of a reset signal sent from the second circuit portion based on the scalable frequency core clock signal, and wherein the accumulated sum of ticks is provided to the second circuit portion in response to detecting the edge of the reset signal.

8. The circuit of claim 7, wherein the first circuit portion comprises the internal timebase counter that is driven by the fixed frequency clock signal, and wherein the internal timebase counter generates a tick every predetermined number of cycles of the fixed frequency clock signal.

9. The circuit of claim 7, wherein the second circuit portion includes an adder that receives, as a first input, the accumulated sum of ticks from the first circuit portion and, as a second input, a current value of a timebase value stored in the second circuit portion, and wherein the adder outputs an updated timebase value.

10. The circuit of claim 9, wherein the updated timebase value is output by the second circuit portion for use by a microprocessor to perform time based operations.

11. The circuit of claim 7, wherein the circuit is part of a microprocessor.

12. The circuit of claim 11, wherein the microprocessor is part of one of a toy, a game machine, a game console, a hand-held computing device, a personal digital assistant, a communication device, a wireless telephone, a laptop computing device, a desktop computing device, or a server computing device.

13. A method of providing a circuit, comprising:
providing a first circuit portion that is driven by a fixed frequency clock signal, wherein the first circuit portion comprises an external timebase circuit that comprises a timebase signal input pin and an edge detect circuit element that detects an edge of a timebase input signal received via the timebase signal input pin and wherein the edge detect circuit element generates a tick in response to detecting a rising edge of the timebase input signal; and
providing a second circuit portion, coupled to the first circuit portion, that is driven by a scalable frequency core clock signal, wherein the first circuit portion accumulates a sum of ticks of one of an internal timebase counter or a sampled external timebase signal based on the fixed frequency clock signal and provides the accumulated sum of ticks to the second circuit portion based on the scalable frequency core clock signal,
wherein the first circuit portion comprises a timebase accumulator that is driven by the fixed frequency clock signal and accumulates the sum of ticks;
wherein the timebase accumulator comprises an edge detect circuit element that detects an edge of a reset signal sent from the second circuit portion based on the scalable frequency core clock signal, and wherein the accumulated sum of ticks is provided to the second circuit portion in response to detecting the edge of the reset signal.

14. The circuit of claim 13, wherein the first circuit portion includes the internal timebase counter that is driven by the fixed frequency clock signal, and wherein the internal timebase counter generates a tick every predetermined number of cycles of the fixed frequency clock signal.

15. The circuit of claim 13, wherein the second circuit portion includes an adder that receives, as a first input, the accumulated sum of ticks from the first circuit portion and, as a second input, a current value of a timebase value stored in the second circuit portion, and wherein the adder outputs an updated timebase value.

16. The circuit of claim 15, wherein the updated timebase value is output by the second circuit portion for use by a microprocessor to perform time based operations.

17. The circuit of claim 13, wherein the circuit is part of a microprocessor.

18. The circuit of claim 17, wherein the microprocessor is part of one of a toy, a game machine, a game console, a hand-held computing device, a personal digital assistant, a communication device, a wireless telephone, a laptop computing device, a desktop computing device, or a server computing device.

* * * * *